(12) United States Patent
Smithson et al.

(10) Patent No.: US 6,483,024 B1
(45) Date of Patent: Nov. 19, 2002

(54) PANEL GASKET

(75) Inventors: Stephen D. Smithson, Redwood City, CA (US); Steven J. Dean, Chippewa Falls, CA (US)

(73) Assignee: Silicon Graphics, Inc., Mountain View, CA (US)

( * ) Notice: Subject to any disclaimer, the term of this patent is extended or adjusted under 35 U.S.C. 154(b) by 60 days.

(21) Appl. No.: 09/608,378

(22) Filed: Jun. 30, 2000

(51) Int. Cl.[7] ................................................. H05K 9/00
(52) U.S. Cl. ................................ 174/35 GC; 174/35 R
(58) Field of Search ...................... 174/35 GC, 35 R; 361/753, 799, 800, 816, 818; 277/920; 439/608, 609

(56) References Cited

U.S. PATENT DOCUMENTS

| | | | |
|---|---|---|---|
| 4,999,459 A | 3/1991 | Smith et al. | 174/35 GC |
| 5,079,388 A | 1/1992 | Balsells | 174/35 GC |
| 5,083,239 A * | 1/1992 | Sedlemeier et al. | 174/35 GC |
| 5,160,806 A | 11/1992 | Harada et al. | 174/35 GC |
| 5,204,496 A | 4/1993 | Boulay et al. | 174/35 GC |
| 5,388,995 A | 2/1995 | Rudy, Jr. et al. | 439/61 |
| 5,473,110 A | 12/1995 | Johnson | 174/35 GC |
| 5,474,309 A | 12/1995 | Balsells | 277/163 |
| 5,511,798 A | 4/1996 | Kawamoto et al. | 277/205 |
| 5,512,709 A | 4/1996 | Jencks et al. | 174/35 GC |
| 5,524,908 A | 6/1996 | Reis | 277/233 |
| 5,597,979 A | 1/1997 | Courtney et al. | 174/35 R |
| 5,599,027 A | 2/1997 | Balsells | 277/163 |
| 5,641,438 A | 6/1997 | Bunyan et al. | 264/40.3 |
| 5,646,368 A | 7/1997 | Muyshondt et al. | 174/33 |
| 5,770,822 A | 6/1998 | Abolitz et al. | 174/35 GC |
| 5,804,762 A | 9/1998 | Jones et al. | 174/356 |
| 5,952,608 A * | 9/1999 | Kim | 174/35 GC |
| 6,080,930 A * | 6/2000 | Lommen et al. | 174/35 GC |
| 6,320,120 B1 * | 11/2001 | Van Haaster | 174/17 CT |

OTHER PUBLICATIONS

Butler, J., "Design Consideration for EMI Gaskets", *Medical Device & Diagnostic Industry*, found at this web address: http://www.devicelink.com/mddi/archive/98/02/014.html, 5 pgs., (Feb. 1998).

* cited by examiner

*Primary Examiner*—Dean A. Reichard
*Assistant Examiner*—Carmelo Oliva
(74) *Attorney, Agent, or Firm*—Schwegman, Lundberg, Woessner & Kluth, P.A.

(57) ABSTRACT

A device for reducing electromagnetic interference (EMI) leakage through an opening in a housing. The device accepts a printed circuit board or dummy board. Various openings may be provided in the device. The device includes a faceplate, a gasket having a plurality of fingers, and a supporter. The supporter protects the leading edge of the fingers and augments the forces exerted by the fingers in opposition to the opening in the housing.

22 Claims, 14 Drawing Sheets

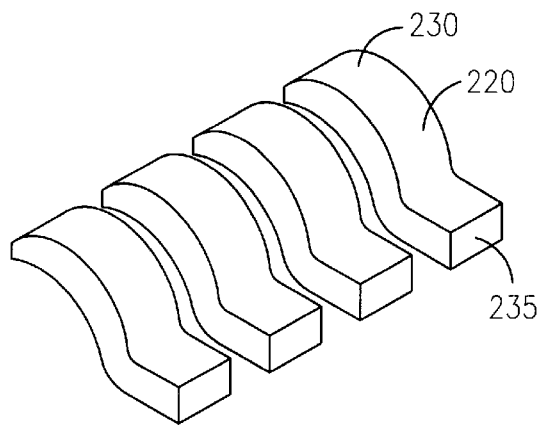
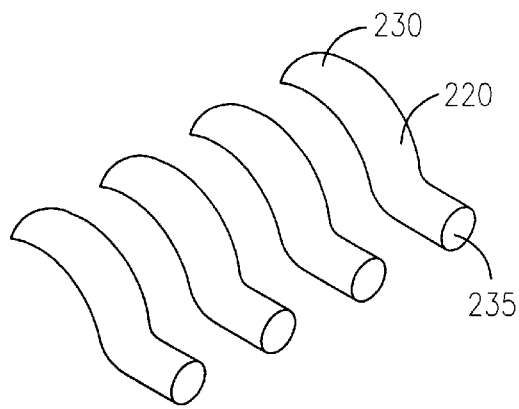
FIG. 14A FIG. 14B
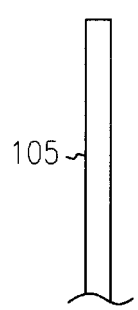
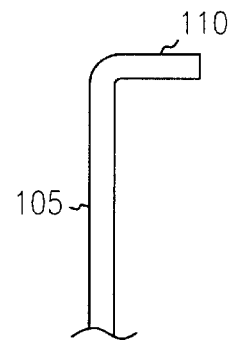
FIG. 15A FIG. 15B

PANEL GASKET

TECHNICAL FIELD OF THE INVENTION

The present invention relates generally to the field of electromagnetic interference and, in particular, to a panel gasket to reduce electromagnetic interference.

BACKGROUND

Electromagnetic interference (EMI) affects the performance of electrical equipment. A particular electrical circuit may both generate interference and be affected by external interference sources. Low power and low frequency circuits are particularly prone to spurious emissions from EMI. Conversely, high power and high frequency signal sources are typical sources of spurious radiation of EMI.

Reducing undesirable interference, or sensitivity, is largely accomplished by shielding sensitive components. Shielding may take the form of encasing a particular circuit in a metal housing wherein efficiency is maximized by providing a continuous, low impedance electrically conductive housing.

External electrical connections to such a circuit often creates undesirable sources for leakage of EMI. Also, indicator lights, controls and other devices preclude the practical implementation of a complete metal housing surrounding a circuit in many applications.

A typical electrical device includes a number of printed circuit boards equipped with edge connectors. The boards are inserted through an opening in the housing of the electrical device and electrical connections are established by means of edge connectors. The electrical housing is typically of metal construction and, thus, provides a degree of EMI shielding for the inserted electrical printed circuit boards. Indicator lights, such as LEDs, controls, and other connectors may also be attached to the individual circuit boards. Any gaps or openings in the housing creates a possibility of harmful EMI leakage.

For the reasons stated above, and for other reasons stated below which will become apparent to those skilled in the art upon reading and understanding the present specification, there is a need in the art for a substantially leak-proof, robust gasket to address the problem of undesirable EMI transmissions.

SUMMARY

The above mentioned problems associated with electromagnetic interference mitigation, and other problems, are addressed by the present invention and will be understood by reading and studying the following specification.

In particular, an illustrative embodiment of the present invention includes an apparatus for reducing electromagnetic interference, wherein the apparatus includes a cover, a gasket and a supporter. The cover includes a cover face and four cover side walls with each cover side wall substantially normal to the cover face. The cover face and cover side walls form a first cavity. The gasket includes a gasket face and four gasket side walls, each gasket side wall substantially normal to the gasket face and the gasket face and the gasket side walls form a second cavity. The gasket face is adapted to mate with the first cavity. The gasket side walls include a plurality of fingers. Each finger has an end proximate to the gasket face and an end distal to the gasket face, and a middle portion arched in a direction away from the gasket face. The distal end of each finger is aligned substantially normal to the gasket face and the gasket is electrically conductive. The supporter includes a supporter face and four supporter side walls. Each supporter side wall is substantially normal to the supporter face and the supporter face is adapted to mate with the second cavity. Each supporter sidewall includes a slidable engagement portion adapted to receive the distal end of a predetermined number of fingers.

In an alternative embodiment, the cover, gasket and supporter are bonded with spot welds. In one embodiment, for each finger, the proximate end is aligned substantially normal to the gasket surface. In one embodiment, the gasket comprises spring steel. In one embodiment, a mounting tab is connected to the supporter and the mounting tab is adapted for affixation of the apparatus to a printed circuit board. In one embodiment, a handle is connected to the cover and enables manual manipulation of the apparatus. In one embodiment, the apparatus includes a hole in the cover face, gasket face and supporter face and the hole in each of the cover, gasket and supporter is aligned.

In an alternative embodiment, the present invention provides a method of manufacturing an EMI gasket. The method includes providing a cover, forming an electrically conductive gasket, forming a support, coupling the cover to the gasket and coupling the gasket to the support. The cover has a cover face. The gasket defines a cavity and has a plurality of fingers, wherein each finger has a configuration adapted to exert a force in opposition to forces directed toward the cavity. The support slidably engages a portion of each finger and mates with the cavity.

In one embodiment, forming an electrically conductive gasket comprises forming a laser etched gasket. One embodiment includes tempering the gasket. One embodiment includes attaching a planar member to the support. One embodiment provides that coupling the cover to the gasket comprises spot welding. One embodiment provides that coupling the gasket to the support comprises spot welding. One embodiment provides that forming an electrically conductive gasket comprises forming fingers having an arched configuration.

In one embodiment, the present invention provides an apparatus comprising a faceplate, a gasket and an inner support. The faceplate includes a front and a back. The gasket includes a planar surface and a side substantially orthogonal to the planar surface. The planar surface includes a front and a back and the front of the planar surface is coupled to the faceplate back. The side includes a plurality of linear members with each linear member having a trailing end coupled to the planar surface, a leading end distal to the planar surface, and a middle region between the trailing end and the leading end, wherein the gasket is electrically conductive. For each linear member, the middle region is positioned further from the planar surface than the leading end. The inner support is coupled to the planar surface back. The inner support has a side member adapted to slidably engage the leading end of a predetermined number of linear members. The inner support is adapted to oppose deflection of the predetermined number of linear members in a direction parallel to the planar surface.

In one embodiment, the faceplate, gasket, and inner support are substantially rectangular in shape. In one embodiment, the plurality of linear members comprises a first linear member and a second linear member wherein the leading end of the first linear member is coupled to the leading end of the second linear member. In one embodiment, the gasket comprises tempered steel. In one embodiment, the faceplate, the gasket, and the inner support are coupled by a weld. In one embodiment, the apparatus includes a board mounting device coupled to the inner support and the device is adapted to rigidly couple with a board. In one embodiment, the faceplate includes an edge substantially perpendicular to the faceplate and extending in a direction parallel to the plurality of linear members. In one embodiment, each linear member is arched.

BRIEF DESCRIPTION OF THE DRAWINGS

FIGS. 14A and 14B illustrate alternative embodiments of fingers 220.

FIGS. 15A and 15B illustrate alternative embodiments of faceplate 100.

DETAILED DESCRIPTION

The following detailed description refers to the accompanying drawings which form a part of the specification. The drawings show, and the detailed description describes, by way of illustration specific illustrative embodiments in which the invention may be practiced. These embodiments are described in sufficient detail to enable those skilled in the art to practice the invention. Other embodiments may be used and mechanical and electrical changes may be made without departing from the scope of the present invention. The following detailed description is, therefore, not to be taken in a limiting sense. Like reference numbers refer to similar items in all the figures.

Figure 1A:
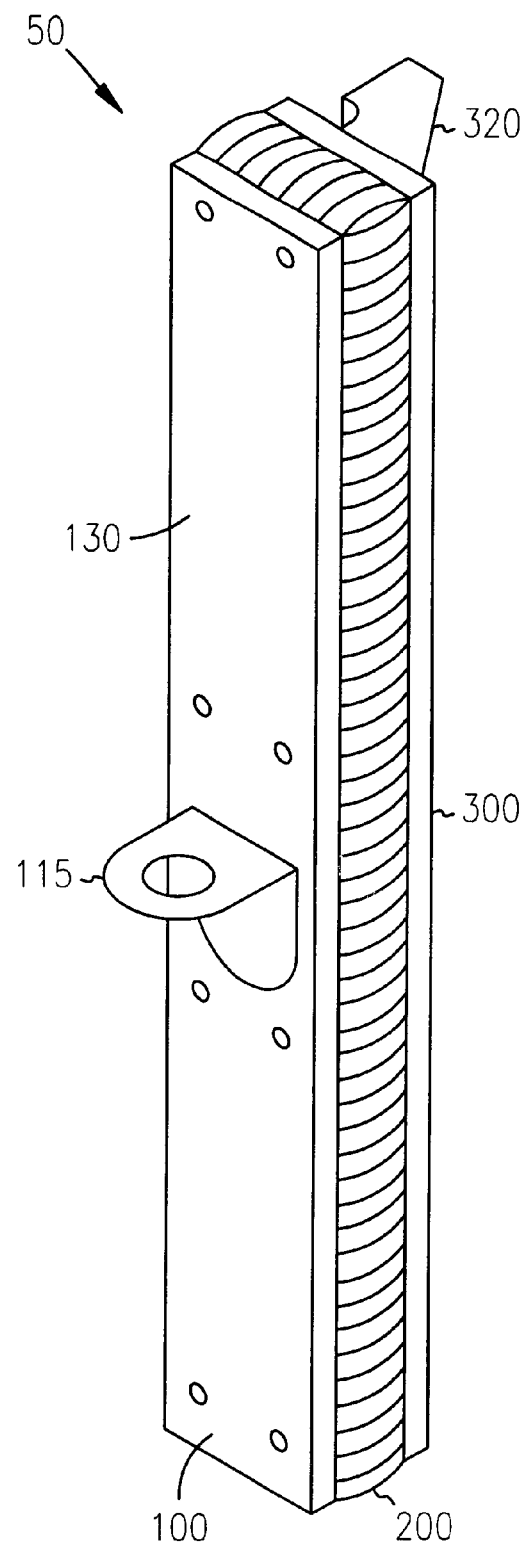
FIG. 1A illustrates one embodiment of the present system.

FIG. 1A depicts an embodiment of device 50. In FIG. 1A, device 50 includes faceplate 100, gasket 200 and supporter 300, each of which is described subsequently. Device 50 is a laminated structure having external dimensions configured to fit within a rectangular opening in an electrical housing. Faceplate 100 provides a rigid support to which other structure of device 50 is attached, and in the embodiment shown, also includes handle 115 for manual manipulation of the device. Also, in the embodiment shown, gasket 200 is of metal construction and is notable for having a comb-like structure. The individual members of the comb-like structure are bowed outward and together, provides sufficient mechanical force with which to contact the sides of an opening in an electrical housing, thus providing a low impedance connection. Supporter 300 adds mechanical rigidity to the comb-like structure of gasket 200 and also provides a mounting means for attachment of a circuit board or blank board by way of mounting tabs 320 shown here positioned at the ends of device 50. Spot welds 130 appear on the faceplate 100 of device 50. The welds provide means of coupling, or bonding, faceplate 100, gasket 200 and supporter 300.

Figure 1B:
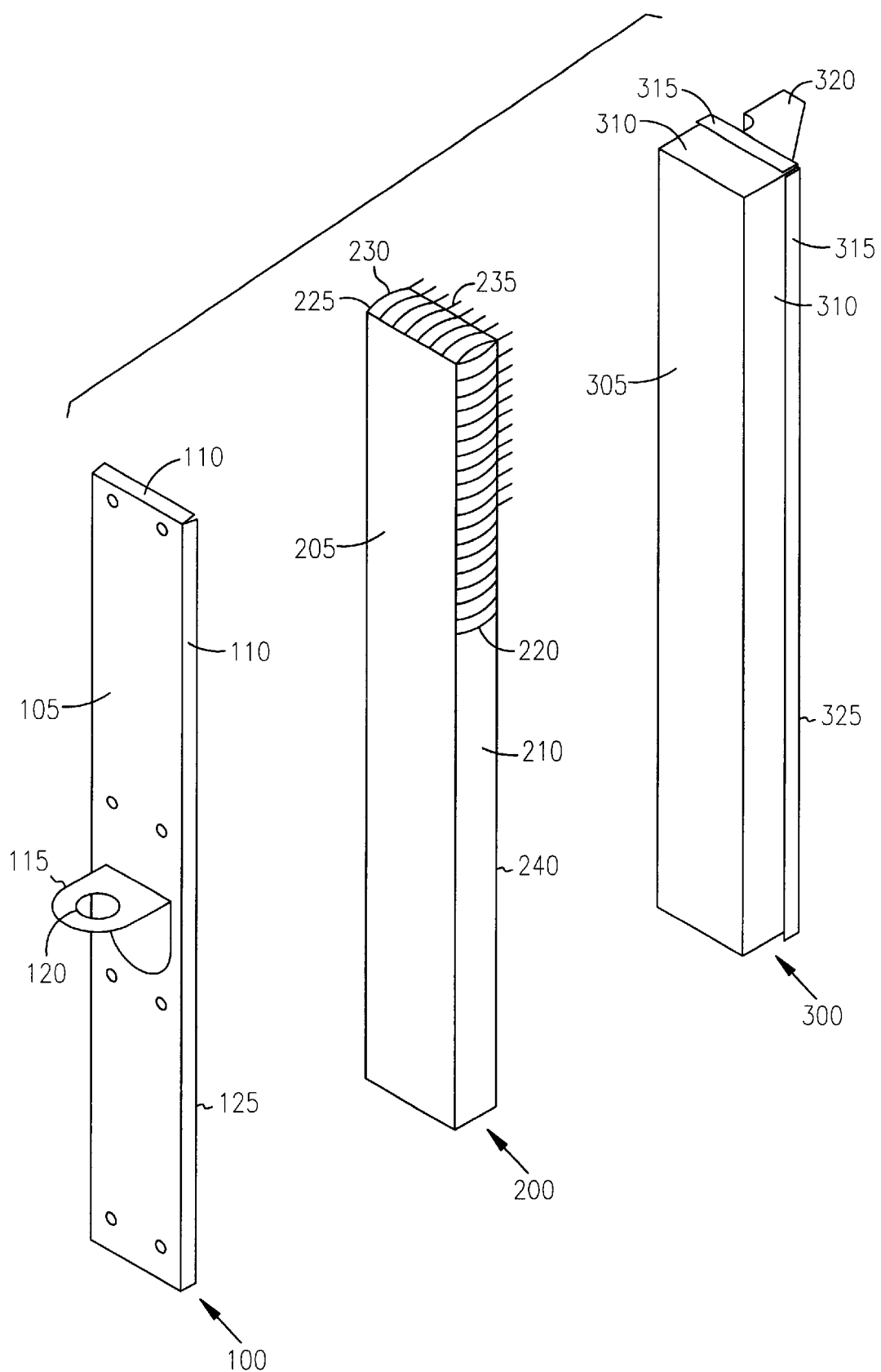
FIG. 1B illustrates components of one embodiment of the present system.

FIG. 1B depicts the faceplate 100, gasket 200 and supporter 300 of FIG. 1A in more detail.

In the embodiment shown, faceplate 100 includes face 105 and four sides 110. Sides, or side walls, 110 extend substantially perpendicular from, or normal to, face 105. Optionally, sides 110 may extend from face 105 at angles more or less than ninety degrees, or alternatively, sides 110 may be omitted. In the embodiment shown, extending forward from the front of face 105 is handle 115. As shown, handle 115 is a folded portion of face 105 and includes hole 120. The rearward side of faceplate 100 is denoted by numeral 125, and is referred to herein as a cavity. The cavity behind faceplate 100 is adapted to receive gasket 200.

Faceplate, or cover, 100 may be fabricated of sheet goods or solid goods. In one embodiment, faceplate 100 is electrically conductive, however, non-conductive, or insulative, materials are also satisfactory. In one embodiment, faceplate 100 is fabricated from 22 gauge stainless steel sheet material having thickness of approximately 0.030" and sides 110 are folded perpendicular to face 105 to form a pan or tray. Optionally, the corners formed between adjacent sides 110 are sealed, soldered, or otherwise bonded. Alternatively, faceplate 100 may be of sufficiently thick flat stock to provide adequate rigidity, or faceplate 100 may incorporate other means of stiffening, such as ribs or formed sections as is known in the art.

In one embodiment, faceplate 100 provides physical rigidity to device 50. In another embodiment, faceplate 100 enables attachment of handle 115.

In the embodiment shown, gasket 200 includes gasket face 205 and four gasket sides, or gasket side walls, 210. Gasket sides 210 extend substantially perpendicular from face 205. Optionally, sides 210 may extend from face 205 at angles more or less than ninety degrees. The rearward side of gasket 200 is denoted by numeral 240, and is referred to herein as a cavity. The cavity behind gasket 200 is adapted to receive supporter 300.

Gasket 200 may be fabricated of sheet goods or solid goods. In one embodiment, gasket 200 is fabricated of electrically conductive material. Alternatively, gasket 200 may be plated, coated or laminated with electrically conductive material. In one embodiment, gasket 200 is fabricated from 22 gauge spring steel sheet material having thickness of approximately 0.030". Fabrication of gasket 200 may include laser cutting or chemical etching. Gasket 200 may be tempered to achieve a desired level of hardness or flexibility. Fingers 220 may be formed by means of suitable dies.

Gasket 200 includes a plurality of fingers 220 extending normal to the edge of face 205. In one embodiment, fingers 220 are bowed outward from cavity 240 formed behind face 205. Face 205 is attached to each finger, or linear member, 220 at an end identified herein as the trailing end and labeled 225. End 235 of each finger 220 is referred to herein as a leading end. Between the trailing end 225 and leading end 235 is middle region, or portion 230. The shape, or contour, of middle region 230, in the embodiment shown, is arched in a semicircular curve and end 235 is straight. In one embodiment, fingers 220 are narrowly spaced and the width of each finger 220 is approximately that of the thickness of the material. Fingers 220 electrically couple with edges of the opening in the housing into which the device is inserted. In one embodiment, the finger spacing and width is selected to minimize leakage of EMI. The finger spacing and width need not be of uniform dimension. The depth of each side 210 is determined as a function of the length of each finger, or linear member 220. The length of each finger 220 is selected to be of a dimension longer than the depth of each side 110, if any, of faceplate 100. In one embodiment, gasket 200 is a continuous sheet devoid of any holes or other potential sources of EMI leakage.

In the embodiment shown, supporter 300 includes supporter face 305 and four supporter sides 310. In the embodiment shown, sides, or side walls, 310 extend substantially perpendicular from, or normal to, supporter face 305. Optionally, sides 310 may extend from face 305 at angles more or less than ninety degrees. The rearward side of supporter 300 is denoted by numeral 325, and is referred to herein as a cavity. Supporter 300 is adapted to fit within the cavity formed behind gasket 200.

Supporter, or inner supporter, 300 may be fabricated of sheet goods or solid goods. In one embodiment, supporter 300 is electrically conductive, however, nonconductive, or insulative, materials are also satisfactory. In one embodiment, supporter 300 is fabricated from 22 gauge stainless steel sheet material having thickness of approximately 0.030" and sides 310 are folded perpendicular to face 105 to form a pan or tray. Optionally, the corners formed between adjacent sides 310 may be sealed, soldered, or otherwise bonded. Alternatively, supporter 300 may be sufficiently thick stock to provide adequate rigidity or supporter 300 may incorporate other means of stiffening, such as ribs or formed sections as is known in the art.

In one embodiment, sides 310 are attached to face 305 at a first edge and include a formed hem at a second edge 315. Hem 315 is sufficiently open to receive the leading end 235 of fingers 220 of gasket 200. Thus, fingers 220 are slidably engaged in hem 315 of supporter 300. In the embodiment shown, mounting tab 320 is attached to the rearward side of supporter 300. A second mounting tab 320 is also attached to supporter 320 but is hidden from view in FIG. 1B.

In one embodiment, faceplate 100, gasket 200 and supporter 300 are bonded by spot welding. Referring again to FIG. 1A, it will be seen that device 50 includes spot welds in eight places. Alternative means of bonding the laminate structure are also contemplated. For example, in various embodiments, threaded fasteners (such as machine or sheet metal screws) or unthreaded fasteners (such as rivets or heat staked plastic studs) may be used.

Figure 2:
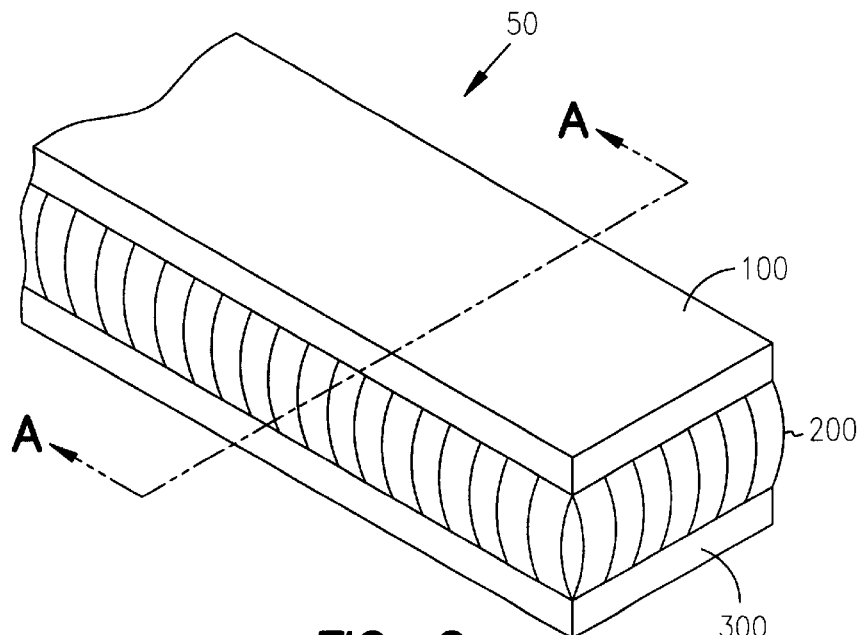
FIG. 2 illustrates one embodiment of the present system.

FIG. 2 illustrates a view an end portion of device 50. Faceplate 100 is shown herein with a pan-shaped profile having sides wrapped around a portion of the fingers 220 of gasket 200. The leading end 235 of gasket 200 is hidden from view behind the formed edge 315 of supporter 300. For clarity, mounting tab 320 and handle 115 are omitted from the embodiment of FIG. 2.

Figure 3:
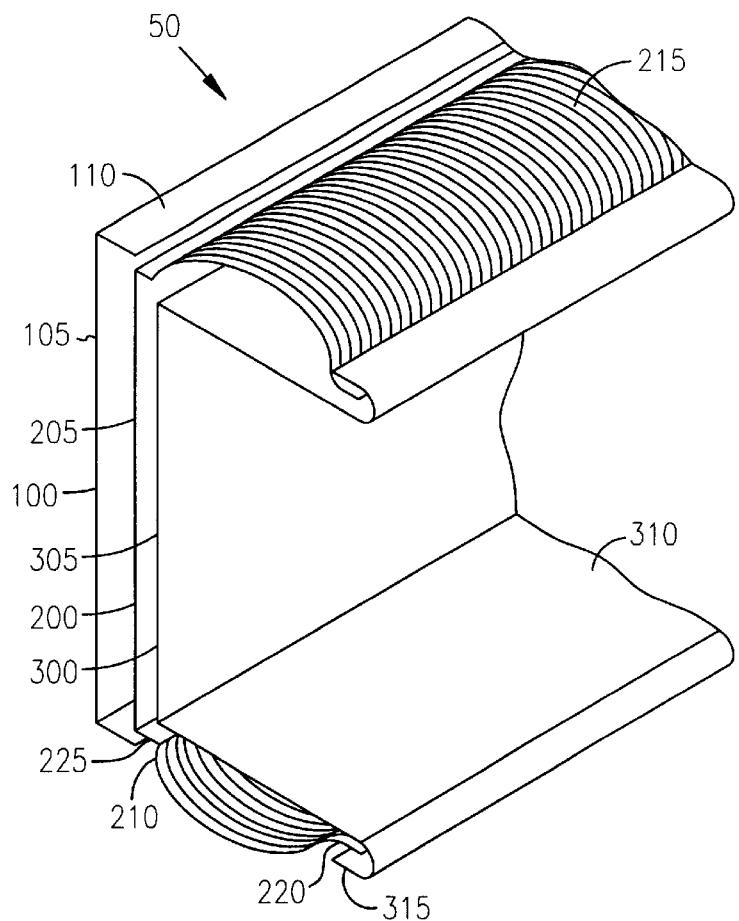
FIG. 3 illustrates a cut-away view of one embodiment of the present system.

FIG. 3 presents a view of device 50 on section line A—[@000a] of an embodiment of FIG. 2. Visible in the diagram is faceplate 100, gasket 200 and supporter 300. Sides 110 extend perpendicular to face 105 of faceplate 100. Sides 110 are positioned beyond the width of face 205. Also, fingers 220 of gasket 200 are positioned beyond the width of face 305 of supporter 300. In this sense, supporter 300 nests within gasket 200, which nests within faceplate 100. The spacing shown between the nested components of FIG. 3 is exaggerated for clarity. Also visible in FIG. 3 is the slidable engagement of fingers 220 into hem 315 of sides 310.

According to a theory of operation, Applicant believes that the plurality of layers, specifically, faceplate 100, gasket 200 and supporter 300, serves to attenuate the mitigation of EMI signals. Junctions, transitions, and other geometric changes in the structure of the apparatus are believed to attenuate EMI signals. EMI signals, consisting of an H-field (magnetic) and an E-field (electric) are attenuated with the structure of the present subject matter. In particular, the E-field energy is dissipated in the form of heat in the present subject matter.

Figure 4:
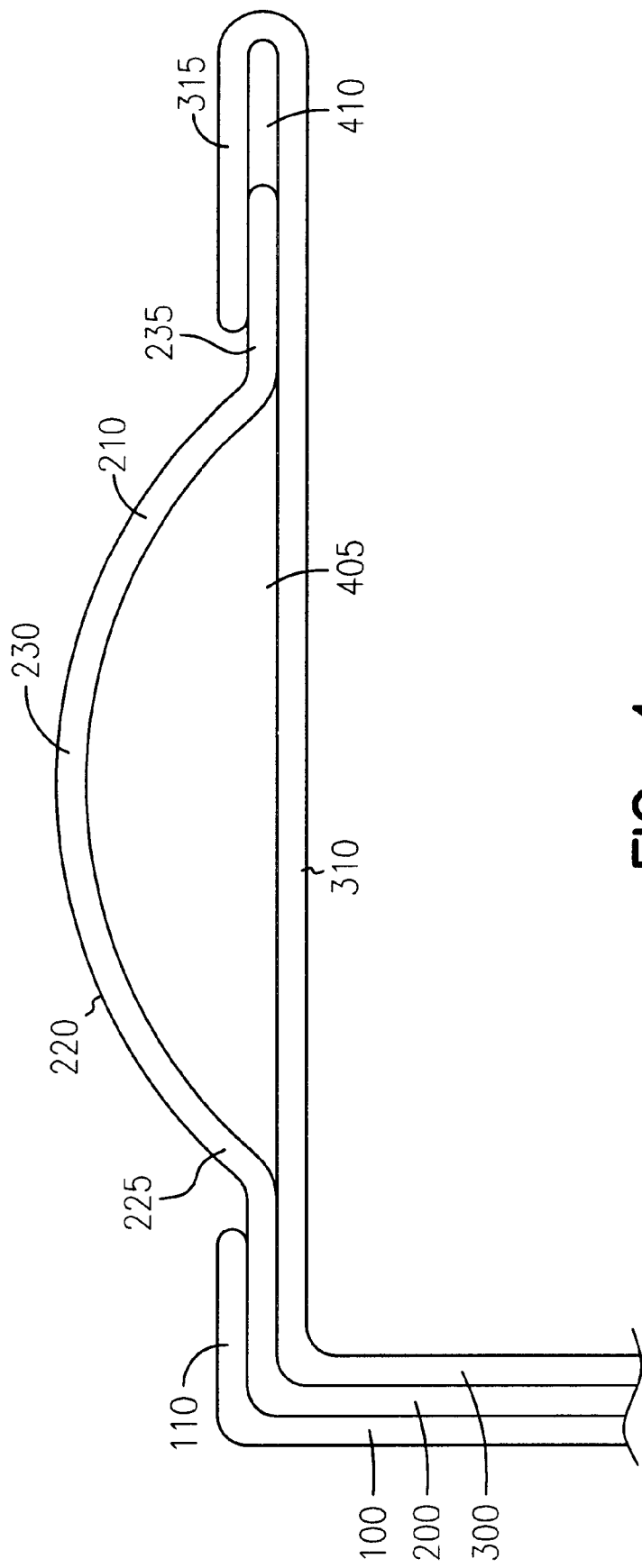
FIG. 4 illustrates one view of an embodiment of the present system.

FIG. 4 presents another view of device 50. As depicted herein, faceplate 100 is laminated on gasket 200 which is laminated on supporter 300. In the embodiment shown, FIG. 4 also presents the relationship between faceplate side 110, gasket side 210 and supporter side 310. As shown, side 110 provides support to trailing end 225 of finger 220. The portion of side 210 nearest face 205 is captivated between faceplate side 110 and supporter side 310. Finger 220 is seen to be arched, or bowed, outward from supporter side 310, thus creating void 405 between side 310 and finger 220. In the orientation presented herein, middle 230 extends above side 110. One of ordinary skill in the art will note that faceplate 110 need not be so limited. FIG. 4 also shows leading end 235 of finger 220 slidably captured under hem 315, thus creating void 410. In the embodiment shown, side 110, side 210, and side 310 are said to extend substantially perpendicular to the face 105, face 205, and face 305, respectively.

Figure 5:
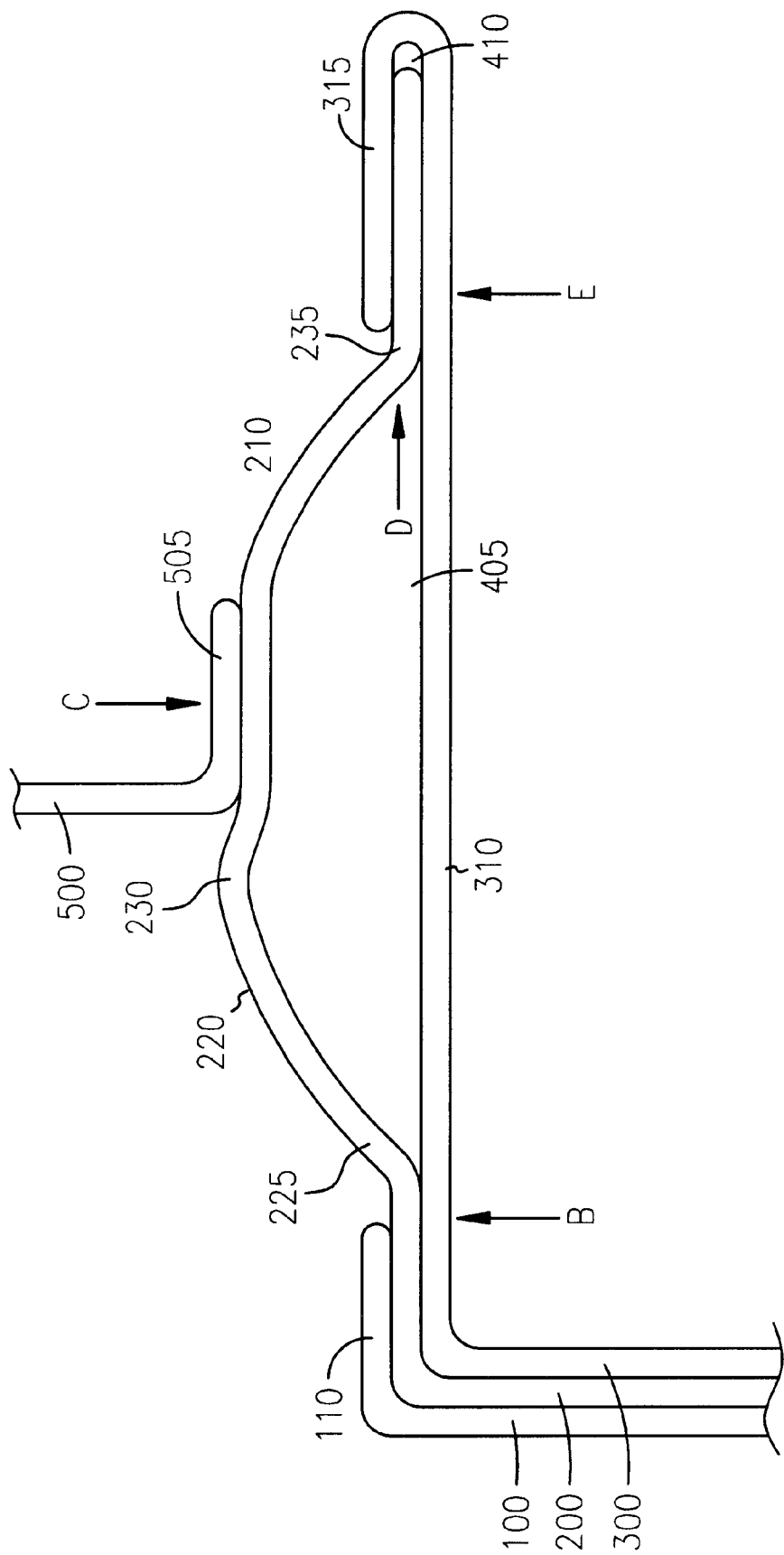
FIG. 5 illustrates another view of the embodiment of FIG. 4.

FIG. 5 illustrates device 50 of FIG. 4 inserted in housing 500. Housing 500 includes an opening, the edge of which is depicted by flange 505, however the opening of housing 500 is not so limited and may be a straight edge. Insertion of device 50 into the opening entails moving device 50 in the direction of arrow D, or alternatively, moving housing 500 in a direction opposite that of arrow D. Upon insertion, the structural rigidity of housing 500 deflects each of fingers 220 in the manner shown. Comparison with FIG. 4 shows that middle 230 is in a lower position. The force exerted by housing 500, exerted in the direction of arrow C, results in reduction of the area described by void 405. Counteracting this force, in the embodiment shown, is supporter 300 as shown by arrow B and arrow E. Supporter 300 is of sufficient rigidity to oppose the load forces of housing 500 without substantial deflection. In addition to the reduction of void 405, finger 220 is displaced in the direction of arrow D, thus reducing the area of void 410. Leading end 235 is shown to have slid into the opening of hem 315.

In the embodiment shown, gasket 200, including finger 220, is fabricated of electrically conductive material. Also, housing 500 is electrically conductive. Therefore, a low resistance, or low impedance, connection exists between finger 220 and housing 500. In addition, the contiguous, or substantially contiguous, face 205 of gasket 200 is electrically bonded to housing 500. As a result, EMI transmissions radiating through the opening of housing 500 are impeded by gasket 200 of device 50.

Furthermore, hem 315 provides mechanical support for end 235. Physical handling of device 50, arising during manual manipulation such as removal or insertion, may thus proceed with less concern for the fragility of fingers 220.

Figure 6:
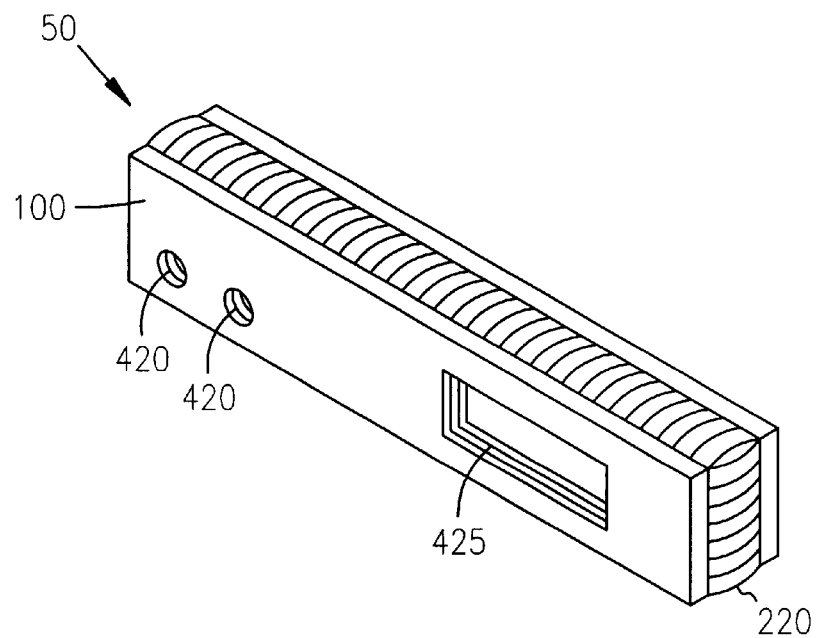
FIG. 6 illustrates a view of one embodiment.

FIG. 6 presents a view of device 50 having a plurality of clearance holes. Holes 420 and 425 may pass through faceplate 100, gasket 200 and supporter 300. Holes 420 may be suitable for viewing lighting sources, such as light emitting diodes (LEDs). Alternatively, a control shaft, cable, or wire may pass through device 50 via circular hole 420. In addition, other shapes of openings may be created in device 50, as shown by rectangular opening 425.

Figure 7:
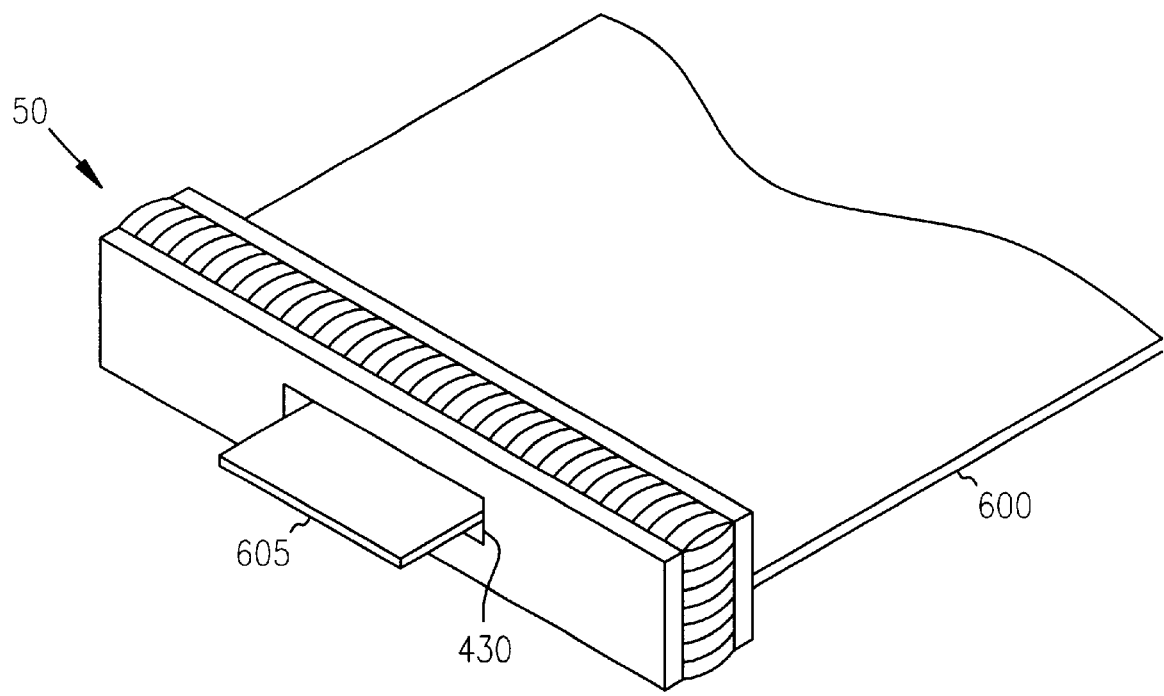
FIG. 7 illustrates a view of one embodiment of the present system having a board attached.

FIG. 7 presents one embodiment of device 50 coupled to board 600. Board 600 may be attached to device 50 by way of an edge connector, face connector, or other type of connector coupled to supporter 300. Board 600 may be an electrical printed circuit board, a blank dummy board or other planar member. Board 600 may also be a non-planar member or other device that may be inserted or removed from housing 500. In the embodiment shown, opening 430 accommodates tab 605. Tab 605 may be integral with board 600 or tab 605 may be attached to board 600 by mechanical or other means. Tab 605, in one embodiment, provides a handle by which device 50, along with board 600, may be inserted or removed from housing 500. Board 600 may include electrical connectors, such as edge or face connectors, for coupling to electrical circuitry on the interior of housing 500. Manual manipulation of device 50 may be facilitated with such mechanisms as handle 115 or tab 605, although the present subject matter is not so limited.

Figure 8A:
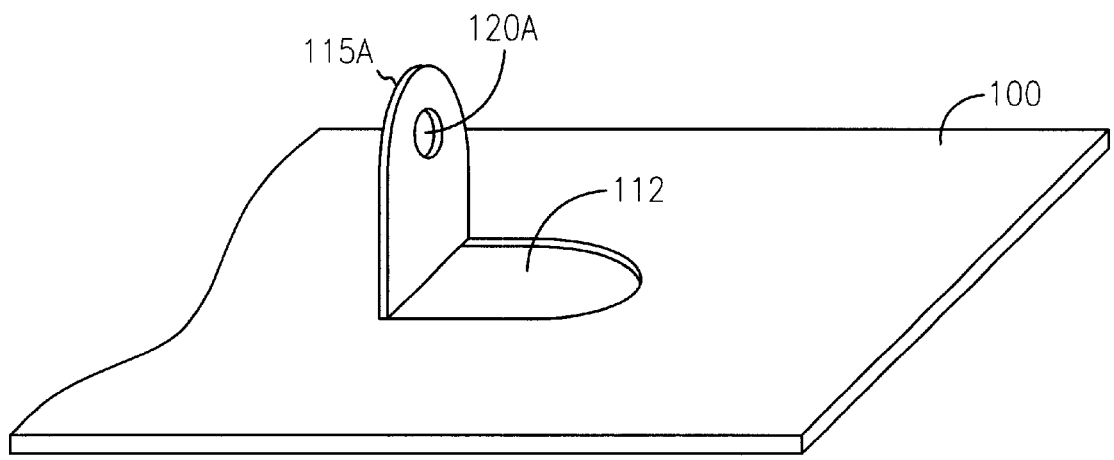
FIGS. 8A and 8B illustrate alternative embodiments of the present subject matter having a handle and are collectively referred to herein as FIG. 8.
Figure 8B:
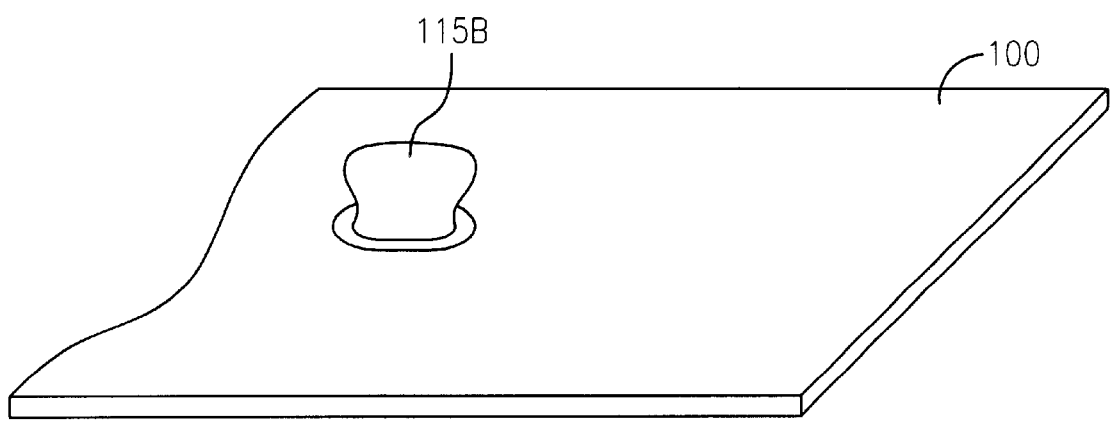

FIG. 8 depicts faceplate 100. In one embodiment, device 50 includes a handle to facilitate removal and insertion. Handle 115A is shown as a cut-out portion of face 105, resulting in opening 112. When assembled to form device 50, gasket 200 is visible through opening 112. Handle 115A includes hole 120A. Handle 115A does not require perforation of gasket 200. In one embodiment, handle 115B is provided. Handle 115B is bonded to face 105 by mechanical, chemical or other means.

Figure 9A:
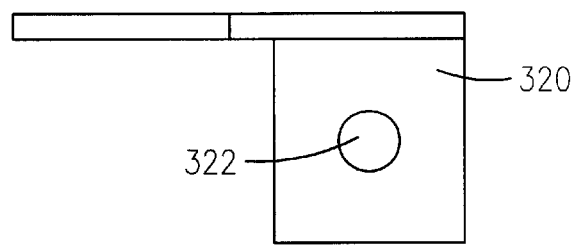
FIGS. 9A and 9B illustrate different views of one embodiment of a board mounting device and are collectively referred to herein as FIG. 9.
Figure 9B:
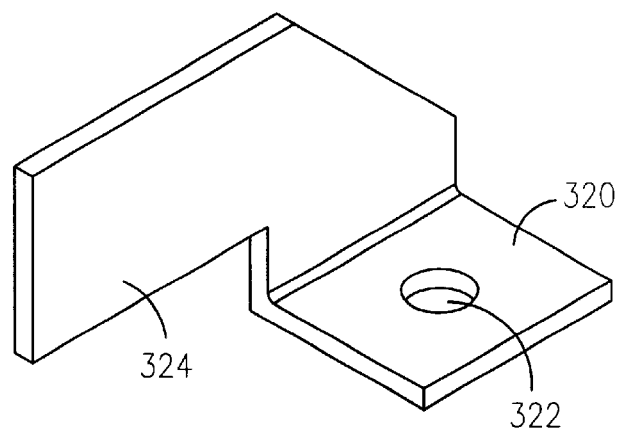

FIG. 9 depicts one embodiment of a mounting tab suitable for attachment of board 600. Mounting tab 320 may be fabricated of conductive or nonconductive material, such as metal or plastic. In the embodiment shown, board 600 is mechanically attached to mounting tab 320 via hole 322. In one embodiment, hole 322 includes internal threads. In one embodiment, hole 322 accepts a self-tapping screw. In one embodiment, hole 322 accepts a rivet or other mechanical fastener. In the embodiment shown, member 324 is attached to supporter 300. Attachment may include mechanical bonding (such as, for example, welding, soldering, riveting) or chemical bonding (such as, for example, gluing). Member 324 may be attached to supporter 300 on an interior side of the cavity formed by supporter 300, by attachment to the face of supporter 300, or by other mans of attachment. In one embodiment, member 324 is integral with supporter 300. In one embodiment, a socket is provided on supporter 300 to accept an edge of board 600. In various embodiments, suitable mounting tabs, or other facilities may be provided to accommodate more than one board 600.

Figure 10A:
FIGS. 10A and 10B illustrate alternative profiles for the present subject matter.
Figure 10B:
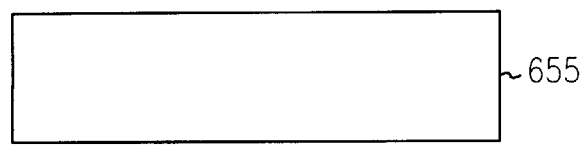

FIG. 10A and FIG. 10B depict two frontal view profiles for device 50. The opening in housing 500 may be round or oval, as shown in FIG. 10A, at 650, or the opening may be square or rectangular, as shown in FIG. 10B, at 655. Other geometric shapes are also contemplated. Gasket 200, and thus, also supporter 300, is shaped to match the opening. Faceplate 100 may also be configured to match the opening in housing 500, or alternatively, faceplate 100 may have a shape or size independent of the opening.

Figure 11A:
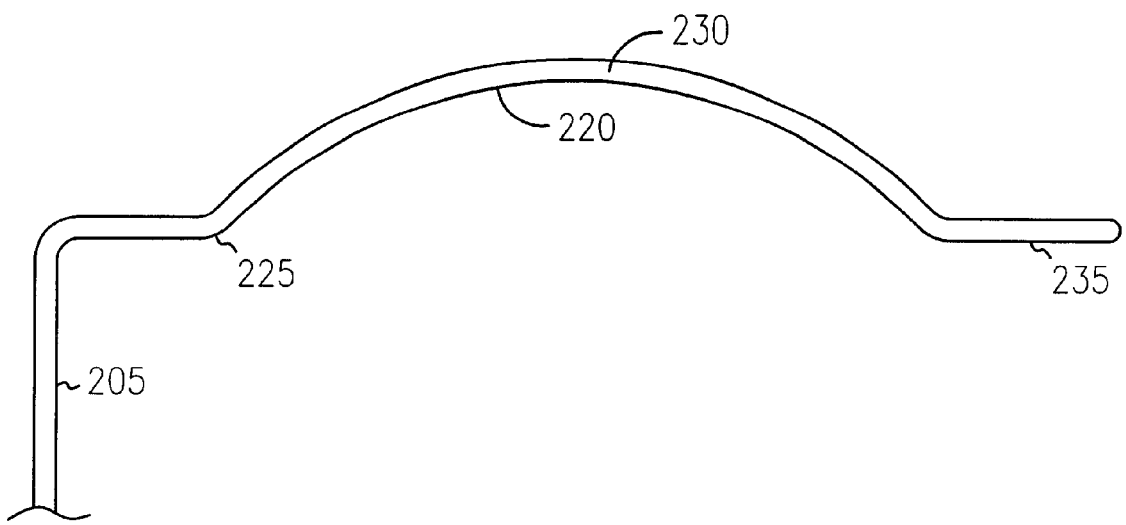
FIGS. 11A, 11B, 11C and 11D illustrate views of alternative embodiments.
Figure 11B:
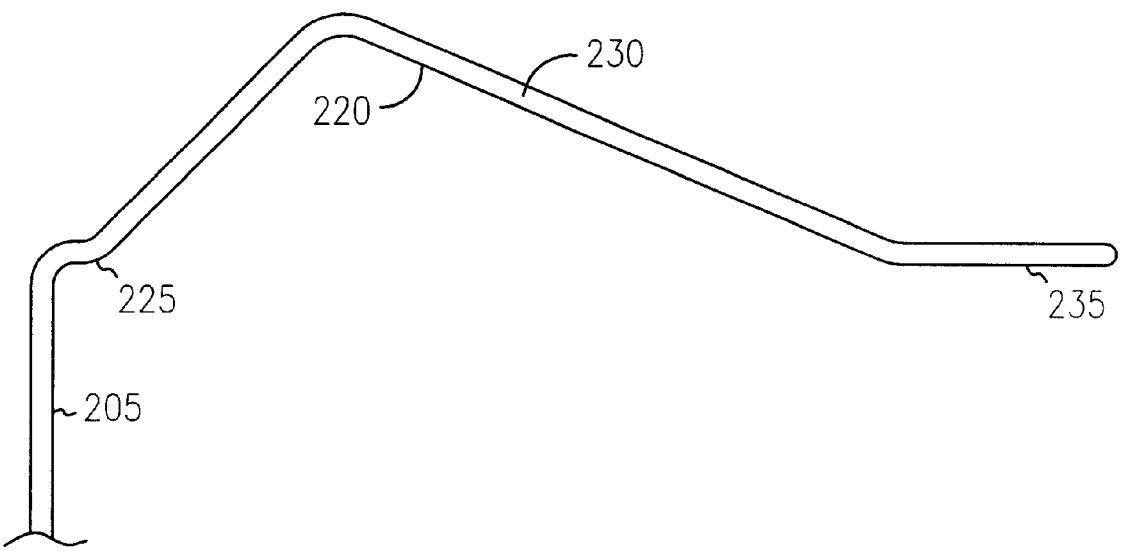
Figure 11C:
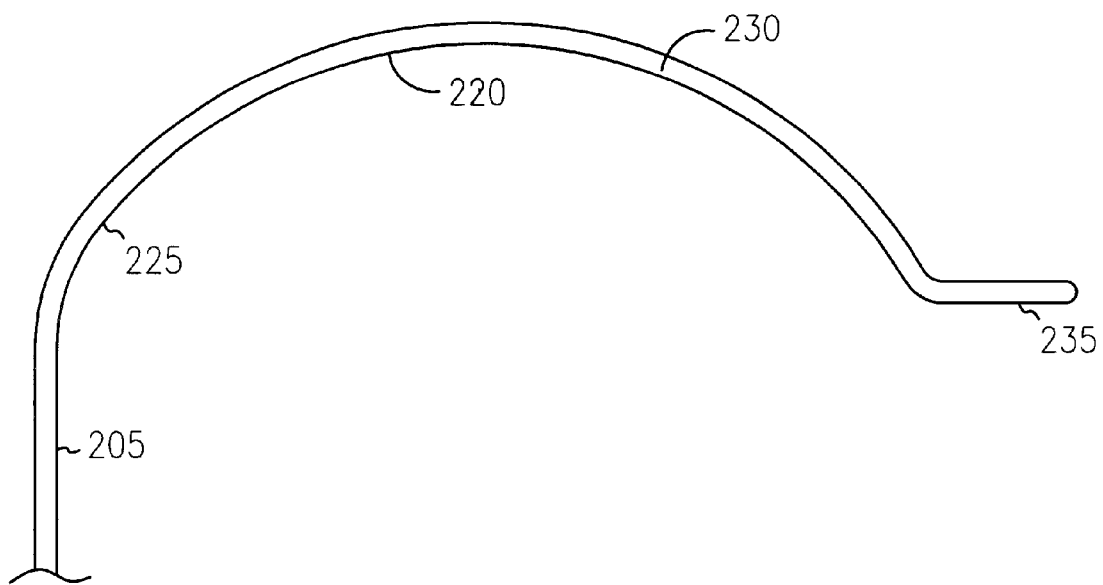

FIGS. 11A, 11B and 11C depict alternative configurations for fingers 220. In FIG. 11A, finger 220 describes an arch, or bow. Trailing end 225 extends from face 205 substantially perpendicular. Leading end 235, in FIG. 11A, as well as in FIGS. 11B and 11C, also is orthogonal with respect to face 205. In FIG. 11B, middle 230 appears as a wedge, triangular, or ramp shape. In FIG. 11C, middle 230 is arched, however, trailing end 225 extends at an angle other than perpendicular with respect to face 205. Other configurations for finger 220 are also contemplated.

Figure 11D:
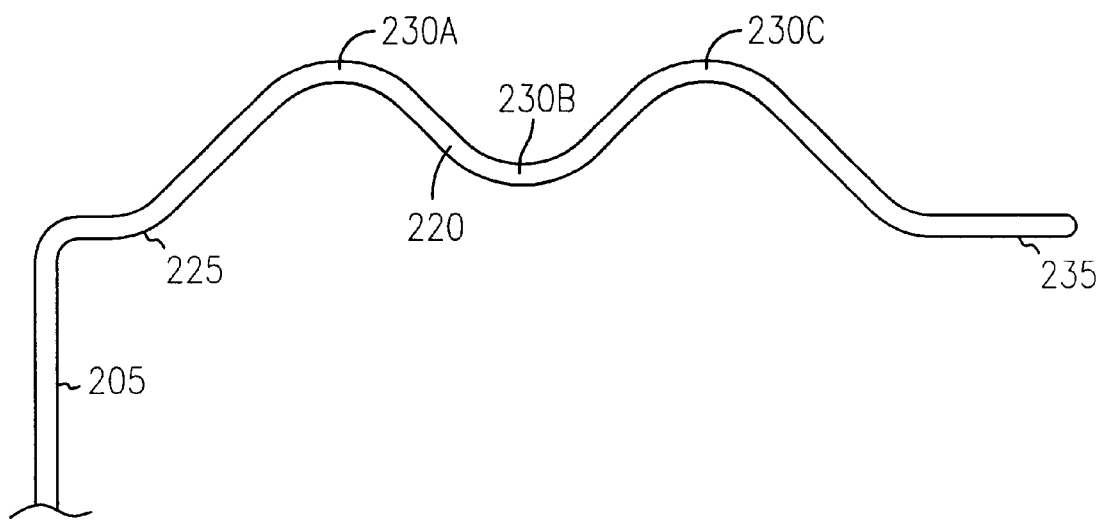
Figure 12A:
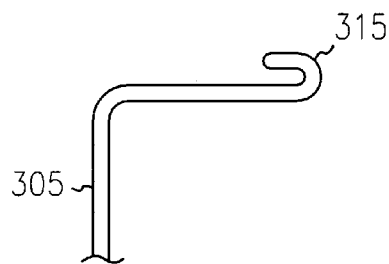
FIGS. 12A, 12B, 12C and 12D illustrate views of alternative embodiments.
Figure 12B:
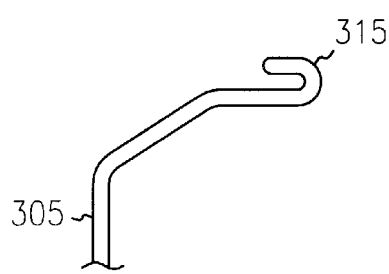
Figure 12C:
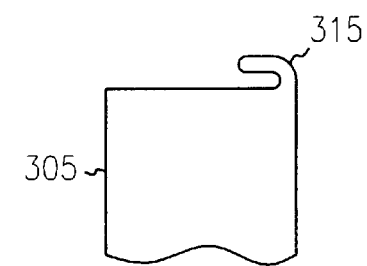
Figure 12D:
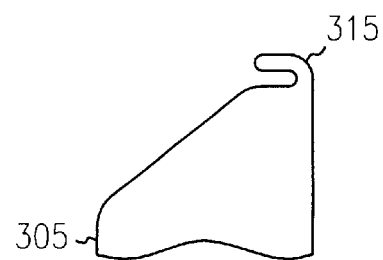

FIG. 11D depicts an alternative configuration for fingers 220. In FIG. 11D, finger 220 describes two arches. Middle 230A identifies a first arch near trailing end 225. Middle 230C identifies a second arch near leading end 235. Middle 230B identifies a region between 230A and 230C. When the apparatus, having fingers as depicted in FIG. 11D, is installed in an opening in a housing (as in FIG. 5, having flange 505), each finger couples to the housing in two locations. The two locations of contact correspond to the first and second arches. The airspace between the first arch and the second arch further attenuates migration of EMI. Finger configurations having more than two arches are also contemplated.

FIG. 12 presents a view of various embodiments for supporter 300. In each of FIGS. 12A, 12B, 12C and 12D, supporter 300 is depicted as having face 305 and hem 315. In FIG. 12A, supporter 300 is fabricated of thin material, such as sheet metal or plastic, and having side 310 extend substantially orthogonal with respect to face 305. In FIG. 12B, supporter 300 is also fabricated of thin material and has an angled portion extending from face 305. This configuration for supporter 300 facilitates easy assembly into the cavity of gasket 200. In FIG. 12C, supporter 300 is fabricated of a solid material. The material may be conductive or non-conductive. In FIG. 12D, supporter 300 is depicted of solid material and features a chamfered corner.

Figure 13A:
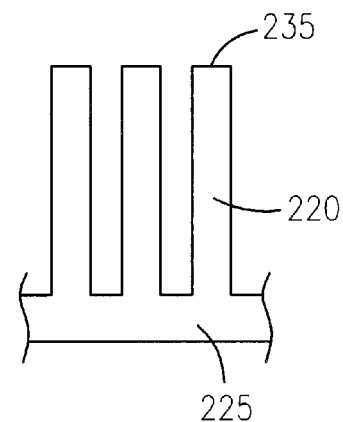
FIGS. 13A and 13B illustrate alternative embodiments of fingers 220.
Figure 13B:
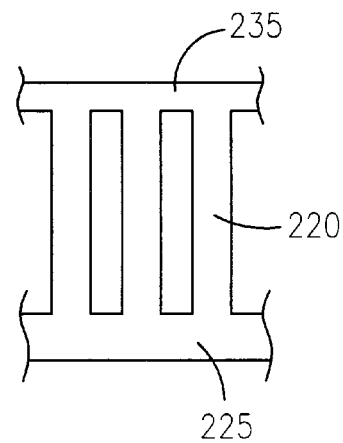

FIG. 13 illustrates a view of alternative embodiments for gasket sides 210. Visible in FIG. 13 are fingers 220 having leading end 235 and trailing end 225. In FIG. 13A, each finger, or linear member is affixed to the adjacent finger at end 225. End 235 of any particular finger 220 may move relatively independently of an adjacent finger 220. Such a configuration may provide a better electrical connection to housing 500. One alternative embodiment is shown in FIG. 13B wherein both end 225 and end 235 of each finger 220 is coupled to an adjacent finger. In this embodiment, movement of one finger 220 may exert forces on an adjacent finger 220.

FIG. 14 illustrates alternative cross sectional configurations for fingers 220. In FIG. 14A, each finger is substantially rectangular in cross section, as shown by end 235. Finger 220 may be fabricated integrally with the formation of gasket 200 and, if using sheet goods, a rectangular cross section is readily achieved. Alternatively, FIG. 14B depicts round cross sectional fingers 220. Fabrication of fingers 220 as shown in FIG. 14B may entail bonding of wire sections to face 205. Such bonding may introduce additional impedance. Wire fingers 220, of FIG. 14B, may be formed into the desired shape either before or after bonding to face 205.

FIG. 15 illustrates a view of alternative embodiments of face 105 of faceplate 100. In FIG. 15A, face 105 is depicted as flat planar surface. In FIG. 15B, face 105 is depicted as having a flat planar surface 105 and sides 110.

Figure 16:
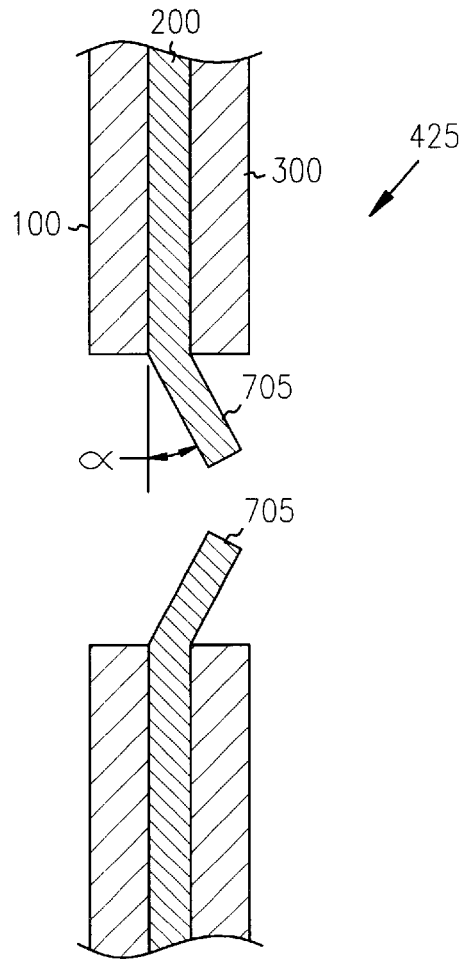
FIG. 16 illustrates a view of one embodiment.

FIG. 16 illustrates an edge view of one embodiment of the present subject matter. Opening 425 passes through faceplate 100, gasket 200 and supporter 300, in the manner as shown in FIG. 6. Opening 425 may be suitable to allow passage of an electrical connector, or other apparatus, through device 50. In the embodiment shown, gasket 200 includes internal fingers 705. In one embodiment, internal fingers 705 are extensions of gasket 200. In the embodiment shown, internal fingers 705 are positioned at an angle α relative to gasket 200. In one embodiment, angle α may be in a range from zero to 90 degrees. In one embodiment, angle α is typically 20 to 30 degrees. In another embodiment, internal fingers 705 are deflected outward. In one embodiment, internal fingers 705 have sufficient length to establish a low impedance, physical connection to an electrical connector inserted in opening 425. Insertion of an electrical connecter, or other apparatus, through opening serves to deflect internal fingers 705 in a direction further inward.

Figure 17:
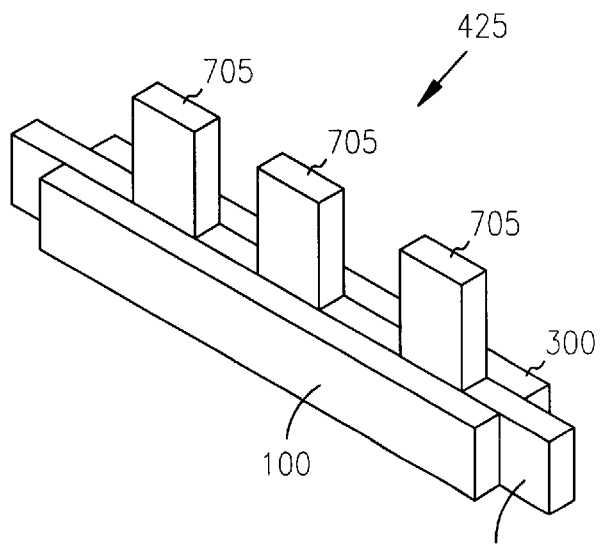
FIG. 17 illustrates a partial view of the embodiment of FIG. 16.

FIG. 17 illustrates a partial view of the embodiment of FIG. 16. FIG. 17 illustrates a portion of faceplate 100, a portion of gasket 200, and a portion of supporter 300. Internal fingers 705 extend substantially perpendicular from the edges of the opening of faceplate 100. In the embodiment shown, internal fingers 705 are spaced at regular intervals around the perimeter of the portion of opening 425 visible in the figure.

Figure 18:
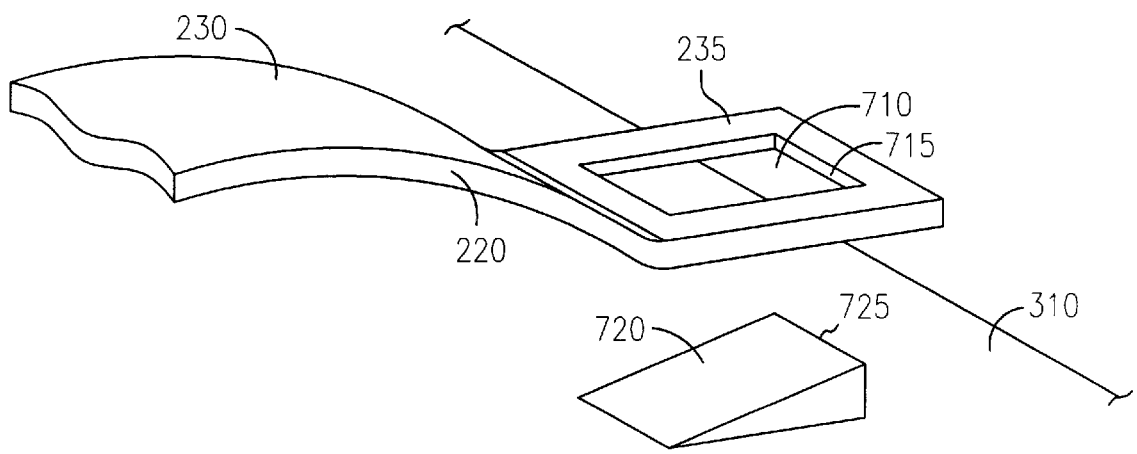
FIG. 18 illustrates an isometric partial view of a finger of one embodiment of the present subject matter.

FIG. 18 illustrates an isometric partial view of a finger of one embodiment of the present subject matter. In the embodiment shown, end 235 of finger 220 includes window 710. Window 710 is a void through end 235 and includes edge 715. Supporter wall 310 includes structure to engage window 710. In the embodiment shown, ramp 720 extends outward from the surface of wall 310 and aligns with window 710. Ramp 720 maybe a lanced, pierced or punched region of wall 310. Ramp 720 may include an angled portion. Displacement of finger 220 during the installation of device 50 in an opening may result in movement of end 235 in a direction towards the trailing end of finger 220. In the embodiment shown, such movement of finger 220 causes surface 725 of ramp 720 to contact edge 715, and thereby resist further motion of end 235.

Figure 19:
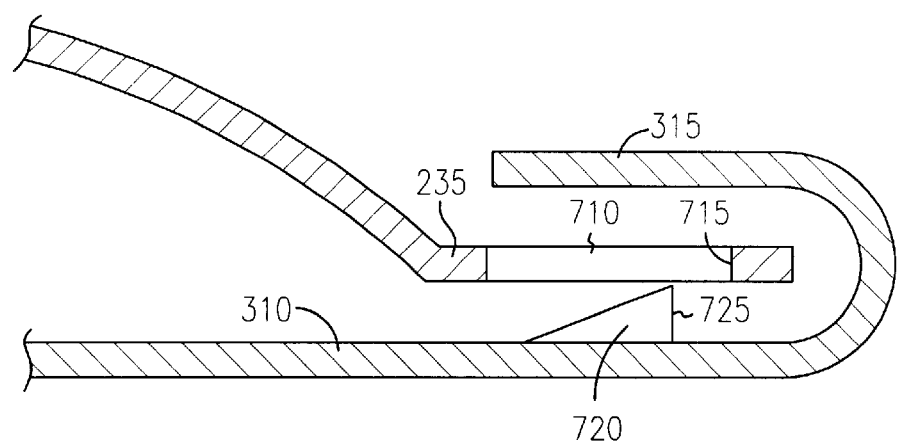
FIG. 19 illustrates an edge view of the finger of FIG. 18.

FIG. 19 illustrates an edge view of the finger of FIG. 18. Window 710 engages ramp 720 upon displacement of finger 220 in a downward direction. Further displacement of end 235 in a direction towards the trailing end of finger 220 is checked by edge 715 contacting surface 725.

Other means of providing a one way mechanical movement are also contemplated. For example, end 235 may be curled inward and engage a hole or perforation in supporter 310. In addition, other ratcheting or locking mechanisms may be employed to oppose excessive deflection, or buckling of finger 220 upon installation of device 50 in an opening in a housing.

Conclusion

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention.

What is claimed is:

1. An apparatus for reducing electromagnetic interference, the apparatus comprising:

a cover having a cover face and four cover side walls, each cover side wall substantially normal to the cover face, wherein the cover face and cover side walls form a first cavity;

a gasket having a gasket face and four gasket side walls, each gasket side wall substantially normal to the gasket face, wherein the gasket face and the gasket side walls form a second cavity, the gasket face adapted to mate with the first cavity, and wherein each gasket side wall includes a plurality of fingers, each finger of the plurality of fingers having a proximate end relative to the gasket face, a distal end relative to the gasket face, and a middle portion between the proximate end and distal end, and wherein for each finger, the middle portion is arched in a direction away from the gasket face, and the distal end is aligned substantially normal to the gasket face, wherein the gasket is electrically conductive; and a supporter having a supporter face and four supporter side walls, each supporter side wall substantially normal to the supporter face, wherein the supporter face is adapted to mate with the second cavity, and wherein each supporter sidewall includes a slidable engagement portion adapted to receive the distal end of a predetermined number of fingers.

2. The apparatus of claim 1 wherein the cover, gasket and supporter are bonded with a plurality of spot welds.

3. The apparatus of claim 1 wherein for each finger, the proximate end is aligned substantially normal to the gasket surface.

4. The apparatus of claim 1 wherein the gasket comprises spring steel.

5. The apparatus of claim 1 further comprising a mounting tab connected to the supporter, the mounting tab adapted for affixation of the apparatus to a printed circuit board.

6. The apparatus of claim 1 further comprising a handle connected to the cover, the handle adapted for manual manipulation of the apparatus.

7. The apparatus of claim 1 wherein the cover face includes a cover hole, the gasket face includes a gasket hole and the supporter face includes a supporter hole, whereby the cover hole, the gasket hole and the supporter hole are aligned.

8. A method of manufacturing an electromagnetic interference gasket, the method comprising:

providing a cover, the cover having a cover face;

forming an electrically conductive gasket, the gasket defining a cavity and having a plurality of fingers, each finger having a configuration adapted to exert a force in opposition to forces directed toward the cavity;

forming a support, the support slidably engaging a portion of each finger and mating with the cavity;

coupling the cover to the gasket; and coupling the gasket to the support.

9. The method of claim 8 wherein forming the electrically conductive gasket comprises forming a laser etched gasket.

10. The method of claim 8 further comprising tempering the gasket.

11. The method of claim 8 further comprising attaching a planar member to the support.

12. The method of claim 8 wherein coupling the cover to the gasket comprises spot welding.

13. The method of claim 8 wherein coupling the gasket to the support comprises spot welding.

14. The method of claim 8 wherein forming the electrically conductive gasket comprises forming the fingers having an arched configuration.

15. An apparatus for reducing electromagnetic interference, the apparatus comprising:

a faceplate having a front and a back;

a gasket having a planar surface and a side substantially orthogonal to the planar surface, the planar surface having a front and a back, wherein the front of the planar surface is coupled to the faceplate back, and further wherein the side includes a plurality of linear members, each member having a trailing end coupled to the planar surface, a leading end distal to the planar surface, and a middle region between the trailing end and the leading end, and wherein the gasket is electrically conductive and further wherein, for each linear member, the middle region is positioned further from the planar surface than the leading end; and an inner support coupled to the planar surface back, the inner support having a side member adapted to slidably engage the leading end of a predetermined number of the linear members and adapted to oppose deflection of the predetermined number of the linear members in a direction parallel to the planar surface.

16. The apparatus of claim 15 wherein the faceplate, gasket, and inner support are substantially rectangular in shape.

17. The apparatus of claim 15 wherein the plurality of linear members comprises a first linear member and a second linear member, and further wherein the leading end of the first linear member is coupled to the leading end of the second linear member.

18. The apparatus of claim 15 wherein the gasket comprises tempered steel.

19. The apparatus of claim 15 wherein the faceplate, the gasket, and the inner support are coupled by a weld.

20. The apparatus of claim 15 further comprising a board mounting device, wherein the device is coupled to the inner support and the device is adapted to rigidly couple with a board.

21. The apparatus of claim 15 wherein the faceplate includes an edge, the edge substantially perpendicular to the faceplate and extending in a direction parallel to the plurality of linear members.

22. The apparatus of claim 15 wherein each linear member is arched.

\* \* \* \* \*